(12) United States Patent
Tsukamoto

(10) Patent No.: US 9,536,715 B2
(45) Date of Patent: Jan. 3, 2017

(54) RECYCLING METHOD FOR TANTALUM COIL FOR SPUTTERING AND TANTALUM COIL OBTAINED BY THE RECYCLING METHOD

(75) Inventor: Shiro Tsukamoto, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 14 days.

(21) Appl. No.: 14/234,699

(22) PCT Filed: Sep. 14, 2012

(86) PCT No.: PCT/JP2012/073586
§ 371 (c)(1),
(2), (4) Date: Jan. 24, 2014

(87) PCT Pub. No.: WO2013/047232
PCT Pub. Date: Apr. 4, 2013

(65) Prior Publication Data
US 2014/0174917 A1 Jun. 26, 2014

(30) Foreign Application Priority Data
Sep. 30, 2011 (JP) .................................. 2011-218017

(51) Int. Cl.
*C23C 14/00* (2006.01)
*H01J 37/34* (2006.01)
(Continued)

(52) U.S. Cl.
CPC ........... *H01J 37/3476* (2013.01); *C23C 14/34* (2013.01); *C23C 14/564* (2013.01);
(Continued)

(58) Field of Classification Search
CPC . H01J 34/3488; H01J 34/3411; C23C 14/3414
See application file for complete search history.

(56) References Cited

U.S. PATENT DOCUMENTS 6,315,872 B1 11/2001 Pavate et al.
6,955,748 B2 10/2005 Kim
(Continued)

FOREIGN PATENT DOCUMENTS

CN 101519767 A 9/2009
CN 101591767 A 12/2009
(Continued)

OTHER PUBLICATIONS

David P. Adams. Micromilling of metal alloys with focused ion beam-fabricated tools. Mar. 28, 2000. Precision Engineering 25 (2001) 107-113.*
(Continued)

*Primary Examiner* — Keith Hendricks
*Assistant Examiner* — Timon Wanga
(74) *Attorney, Agent, or Firm* — Howson & Howson, LLP

(57) ABSTRACT

The present invention relates to a method for recycling a tantalum coil for sputtering that is disposed between a substrate and a sputtering target. The method for recycling a tantalum coil for sputtering is characterized in that the whole or partial surface of a spent tantalum coil is subject to cutting (cutting is performed until a re-deposited film and knurling traces are eliminated) so as to eliminate the re-deposited film that was formed during sputtering, and knurling is newly performed to the cut portion. While sputtered grains are accumulated (re-deposited) on the surface of the tantalum coil disposed between the substrate and the sputtering target during sputtering, by eliminating the sputtered grains accumulated on the spent coil by way of cutting after the sputtering is complete, the tantalum coil can be efficiently recycled. Thus, provided is technology capable of lean manufacturing of new coils, improving productivity, and stably providing such coils.

11 Claims, 1 Drawing Sheet

(51) Int. Cl.
*C23C 14/34* (2006.01)
*C23C 14/56* (2006.01)
*H01J 37/32* (2006.01)

(52) U.S. Cl.
CPC .... *H01J 37/3288* (2013.01); *H01J 37/32853* (2013.01); *H01J 37/34* (2013.01); *H01J 37/3447* (2013.01); *Y10T 29/49748* (2015.01)

(56) References Cited

U.S. PATENT DOCUMENTS

| | | | |
|---|---|---|---|
| 2005/0089699 A1* | 4/2005 | Lin et al. | 428/457 |
| 2006/0213769 A1 | 9/2006 | Lee et al. | |
| 2007/0012658 A1* | 1/2007 | Mize | 216/52 |
| 2008/0135405 A1 | 6/2008 | Hori et al. | |
| 2008/0302657 A1* | 12/2008 | Luten et al. | 204/298.36 |
| 2009/0194414 A1* | 8/2009 | Nolander et al. | 204/298.13 |
| 2010/0166512 A1* | 7/2010 | Tanibuchi | C23C 16/34 407/119 |
| 2011/0162971 A1* | 7/2011 | Nakamura | C23C 14/3414 205/111 |
| 2012/0318668 A1 | 12/2012 | Tsukamoto | |
| 2013/0112556 A1 | 5/2013 | Nagata et al. | |

FOREIGN PATENT DOCUMENTS

| | | |
|---|---|---|
| CN | 101956156 A | 1/2011 |
| JP | 4763101 B1 | 8/2011 |
| KR | 2001-0111908 A | 12/2001 |
| WO | 2011/122317 A1 | 10/2011 |

OTHER PUBLICATIONS

JIS B 0106, "Machine Tools-Parts and Working Methods-Vocabulary", Japanese Industrial Standards, p. 30, 1996 (month unknown) (English language translation provided for selected vocabulary).

JIS B 0170, "Cutting Tools-Vocabulary-Common Terms", Japanese Industrial Standards, pp. 22, 29 & 30, 1993 (month unknown) (English language translation provided for selected vocabulary).

China Large Encyclopedia, Mining Metallurgy Science, Selected Item of Nonferrous Metals (posted paper), published by China Large Encyclopedia Publisher, p. 143, 1982 (month unknown).

* cited by examiner

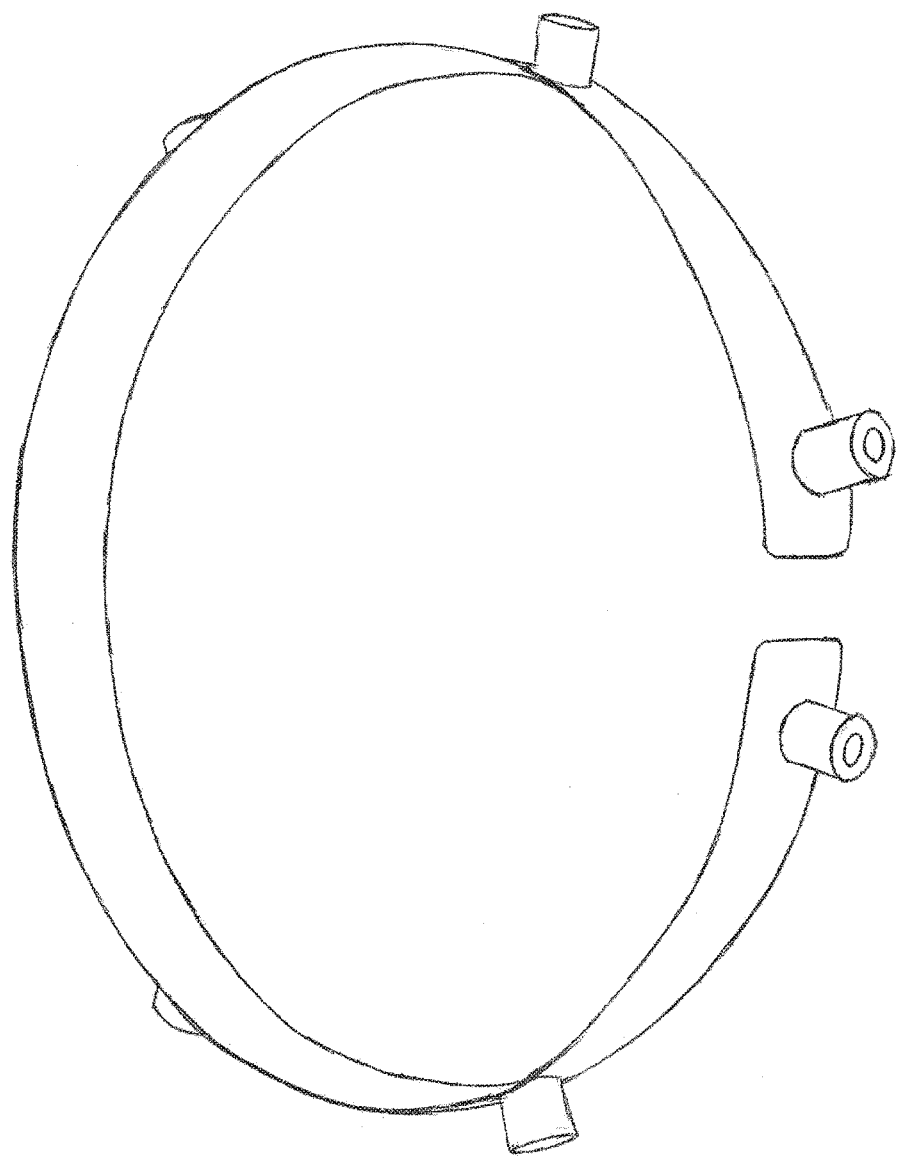

RECYCLING METHOD FOR TANTALUM COIL FOR SPUTTERING AND TANTALUM COIL OBTAINED BY THE RECYCLING METHOD

BACKGROUND

The present invention relates to a method for recycling a tantalum coil for sputtering, wherein a coil, which is disposed so as to surround a space between a substrate and a sputtering target in a sputtering device in order to prevent the coil from becoming the cause of the generation of particles and arcing, undergoes, after the sputtering is complete, a recycling process to eliminate the sputtered grains accumulated on the surface of the spent coil, and additionally relates to a tantalum coil that is recycled thereby.

This tantalum coil for sputtering has a surface that is curved as shown in the photograph explained later, and both the inner surface and the outer surface of the coil are the object of the present invention. Accordingly, the expression "surface of the coil" refers to both the inner surface and the outer surface of the coil, and the same shall apply hereinafter.

In recent years, the sputtering method that is capable of easily controlling the film thickness and components is commonly used as one of the deposition methods of materials for use in electronic and electrical components.

With the sputtering method, a substrate as the positive electrode and a target as the negative electrode are placed opposite each other, and a high voltage is applied between the substrate and the target in an inert gas atmosphere so as to generate an electric field. Here, the ionized electrons and the inert gas collide and plasma is formed. When the positive ions in the plasma collide with the surface of the target (negative electrode), the atoms configuring the target are sputtered, and the sputtered atoms adhere to the opposing substrate surface and thereby form a film.

As recent sputtering technology, there is a technique of disposing a coil in a space between the sputtering target and the substrate to increase the density of the plasma, and to direct the scattered sputtered grains toward the substrate as much as possible. Consequently, the sputtering rate is increased, the uniformity of the film is improved, and the quality of the film that is deposited on the substrate can be comprehensively improved. There are cases where this coil is sputtered and subject to erosion, and cases where this coil is not sputtered and the sputtered grains scatter and adhere to the coil (formation of re-deposited film). This depends on the bias to the coil (refer to Patent Documents 1 and 2).

Accordingly, as the material of the coil, generally used is the same material as the target material, or the material configuring a part of constituents of the sputtered film to be deposited on the substrate. Nevertheless, there is no particular limitation so as long as the coil material does not contaminate the thin film on the substrate. Moreover, as the shape of the coil, there are circular coils and spiral coils (refer to Patent Documents 1, 2, and 3), and there are cases where these coils are disposed in multiple stages.

However, when disposing the foregoing coil between a target and a substrate so as to increase the density of the plasma and direct the scattered sputtered grains toward the substrate as much as possible, while decreasing the amount of sputtered grains that will scatter and adhere to, other than the substrate, the inner wall or the internal elements of the thin-film forming device, there is a problem in that the sputtered grains become accumulated on the coil itself.

In order to avoid this kind of problem, Patent Document 3 described above proposes grinding down the upper end of the inner surface side of the coil so as to reduce the inner peripheral thickness. Here, since the upper end of the coil is sharpened toward the upper direction, the provided explanation is that the deposited material to become accumulated at the apex of the coil slips down and will not remain thereon, and the coil is further cleansed since new sputtered grains will collide therewith.

Nevertheless, the portion where the sputtered grains will accumulate is not limited to the upper end of the coil. There is a possibility that the sputtered grains will also become accumulated on the surface of the coil; that is, on the outer surface and the inner surface of the coil. In the foregoing case, the flakes from the surface of the coil, where the sputtered grains have accumulated, become scattered and adhere directly to the substrate surface. And, it causes the generation of particles, but no measures are being taken for this problem. Based device circuit, the generation of particles from the foregoing locations will also become a major problem.

In order to resolve the foregoing problem, there has been a proposal of blasting the side surface of the target and a portion in the vicinity of the backing plate so as to increase the adhesion based on the anchor effect.

Nevertheless, in the foregoing case, there are the following problems; namely, contamination of the product caused by the residual blasting material, flaking of the adhered grains accumulated on the residual blasting material, and the flaking caused by the selective and non-uniform growth of the adhesive film, and the blasting described above is not a final solution. In particular, when the coil is made of a hard material like tantalum, it is difficult to even form irregularities by simply performing blasting, and it is not possible to effectively enhance the adhesion.

Moreover, Patent Document 4 discloses that a coil to be used for the flange, side wall, shield, covering and the like of a target is subject to knurling to form a diamond-shaped or cross-hatch (net-like) pattern thereon. Here, the depth is roughly 0.350 mm to 1.143 mm, but since the irregularities on the worked surface are of a simple shape, there is a possibility that a sufficient anchor effect cannot be obtained.

As described above, there are basically two types of spent coils, but in the case of a coil that is not subject to erosion, it is necessary to eliminate the re-deposited film therefrom. If the coil is reused without eliminating the re-deposited film, the re-deposited film will peel off and cause the generation of particles.

In the foregoing formation of a thin film based on the sputtering method, if it is possible to efficiently eliminate the re-deposited film from the spent coil after the sputtering is complete and recycle the coil, a significant cost reduction can be achieved.

Conventionally, there are several Patent Documents that are based on the foregoing perspective. Patent Document 5 proposes exposing the deposited material to at least one etching solution selected from a group consisting of $H_3PO_4$, $HNO_3$, and HF in order to prolong the reuse life of a processing kit. Moreover, elimination of the adhered particles (re-deposited film) via etching or pickling is proposed in Patent Document 6 and Patent Document 7. These technologies need to be further improved in order to stably and efficiently eliminate the re-deposited film.

Patent Document 1: Published Japanese Translation No. 2005-538257 of PCT Application Patent Document 2: JP2001-214264 A Patent Document 3: Published Japanese Translation No. 2008-534777 of PCT Application Patent Document 4: WO2009/099775 (PCT/US2009/031777)

Patent Document 5: US2007/0012658

Patent Document 6: CN101519767

Patent Document 7: CN101591767

SUMMARY OF INVENTION

While sputtered grains are accumulated (re-deposited) on the surface of the tantalum coil disposed between the substrate and the sputtering target during sputtering, an object of this invention is to efficiently recycle the tantalum coil by subjecting the spent coil to cutting after the sputtering is complete to trim off the sputtered grains accumulated thereon, and thereby can achieve lean manufacturing of new coils, improve productivity, and stably provide such coils.

If coils can be recycled, it will be possible to provide technology capable of improving the quality and productivity of electronic components, and stably providing semiconductor elements and devices.

Based on the above, the present invention provides:
1) A method for recycling a tantalum coil for sputtering that is disposed between a substrate and a sputtering target, wherein the surface of a spent tantalum coil is wholly or partially cut until irregularities of a re-deposited film or an erosion part and knurling traces are eliminated and a smooth surface is obtained, the re-deposited film formed during sputtering is thereby eliminated, and thereafter knurling is newly performed to the cut portion. The term "smooth surface" used above is defined as Ra≤1.6 μm.

Moreover, the present invention provides:
2) The method for recycling a tantalum coil for sputtering according to 1) above, wherein cutting is performed, based on the cutting conditions that the cutting depth is 0.4 to 0.8 mm, the feed is 0.05 to 0.2 mm/rev, and the rotating speed is 20 to 80 rpm, until irregularities of the re-deposited film or the erosion part and knurling traces are eliminated and a smooth surface is obtained;
3) The method for recycling a tantalum coil for sputtering according to 1) or 2) above, wherein the tantalum coil is provided with irregularities formed by newly performing knurling;
4) The method for recycling a tantalum coil for sputtering according to any one of 1) to 3) above, wherein roughness of the tantalum coil after the newly performed knurling is Ra≥15 μm;
5) The method for recycling a tantalum coil for sputtering according to any one of 1) to 4) above, wherein variation in the thickness (difference between the maximum thickness and the minimum thickness) of the tantalum coil after the newly performed knurling is 0.5 mm or less;
6) The method for recycling a tantalum coil for sputtering according to any one of 1) to 5) above, wherein a cutting amount is adjusted based on the thickness of the re-deposited film; and
7) A tantalum coil for sputtering obtained from the method for recycling a tantalum coil for sputtering according to any one of 1) to 6) above.

While sputtered grains are accumulated (re-deposited) on the surface of the tantalum coil disposed between the substrate and the sputtering target during sputtering, the spent coil is subject to cutting after the sputtering is complete to trim off the sputtered grains accumulated thereon so that the tantalum coil can be efficiently recycled. The present invention yields a superior effect of achieving lean manufacturing of new coils, improving productivity, and stably providing such coils.

Since the present invention can recycle coils with ease and high accuracy, the present invention can provide technology capable of improving the quality and productivity of electronic components, and stably providing semiconductor elements and devices. Also with this recycled coil, as with a new coil, the present invention can prevent the generation of particles, which is caused by flaking of the sputtered grains accumulated on the surface of the coil and the adhesion of the scattered flakes to the substrate surface, and can prevent the generation of arcing; and thereby effectively inhibit the flaking of the sputtered grains accumulated on the surface of the coil.

BRIEF DESCRIPTION OF DRAWINGS

FIG. 1 This is a photograph of the appearance of the coil.

DETAILED DESCRIPTION

With a sputtering device in which a tantalum coil is disposed so as to surround a space between a substrate and a sputtering target, the grains that are sputtered from the tantalum target will become deposited and accumulated on the surface of the tantalum coil around the target (formation of re-deposited film), other than on the wafer. Moreover, the coil is exposed to heat and expands during sputtering.

When the thickness of accumulation of the sputtered grains on the coil surface increases, the film will peel due to stress increase, and such film reaches and adheres to the substrate, and causes the generation of particles or arcing. In order to prevent the foregoing problem, generally speaking, knurling is performed to the coil so as to roughen the surface and increase the peeling resistance. Knurling is a process of forming irregularities by strongly pressing a knurling tool against the work or cutting the work with a knurling tool. The present invention can recycle the knurled coil. A representative example of the knurled coil is shown in FIG. 1.

As described above, grains that scattered due to sputtering adhere to the spent tantalum coil. Generally speaking, this is referred to as a re-deposited film. Cost reduction can be achieved by recycling the tantalum coils.

Upon performing this recycle, the whole or partial surface of the spent tantalum coil is subject to cutting so as to eliminate the re-deposited film that was formed during sputtering. "Cutting" in the foregoing case refers to performing cutting until the irregularities of the re-deposited film or the erosion part and knurling traces are eliminated; that is, until a smooth surface is obtained.

As described above, the re-deposited film that adhered to the uneven portion of the tantalum coil that was subject to knurling can be effectively eliminated. The cutting conditions in the foregoing case are as follows; namely, cutting depth of 0.4 to 0.8 mm, feed of 0.05 to 0.2 mm/rev, and rotating speed of 20 to 80 rpm.

Subsequently, knurling is newly performed to the cut portion in order to recycle the tantalum coil for sputtering. In the foregoing case, desirably, variation in the coil thickness (difference between maximum thickness and minimum thickness) of the tantalum coil after the newly performed knurling is 0.5 mm or less. This is because, if the variation in the coil thickness is large, when the coil is reused, there are problems in that the coil may be subject to the thermal effect of sputtering and deform into an irregular shape, and the thickness of the re-deposited film or the erosion part of the coil may also become varied easily.

The cutting amount can be adjusted based on the thickness of re-deposited film or the thickness of the eroded part of the coil. The present invention can provide a tantalum coil for sputtering obtained based on the method for recycling a tantalum coil for sputtering described above. A tantalum coil that is recycled based on the conditions of the present invention can ensure quality that is equivalent to the quality of a new tantalum coil.

EXAMPLES

The Examples are now explained. Note that these Examples are described for facilitating the understanding of the present invention, and are not intended to limit the present invention in any way. In other words, other examples and modifications within the scope of the technical concept of the present invention are covered by the present invention.

Example 1

With regard to a Ta coil in which the whole area of the coil was subject to erosion, the inner surface, the upper and lower edge parts, and the outer surface were cut based on the following cutting conditions; namely, cutting depth of 0.6 mm, feed of 0.1 mm/rev, and rotating speed of 25 to 63 rpm. In other words, cutting was performed until the erosion parts and knurling traces were eliminated, and a smooth surface was obtained. Subsequently, additional knurling was newly performed to the cut portion.

The surface roughness after knurling was Ra=18.5 μm, and variation in the coil thickness (difference between maximum thickness and minimum thickness) was 0.25 mm. It was thereby possible to obtain a like-new coil.

Example 2

With regard to a coil in which a re-deposited film had adhered to a part of the coil and half of the coil was subject to erosion, the inner surface, the upper and lower edge parts, and the outer surface were cut based on the following cutting conditions; namely, cutting depth of 0.8 mm, feed of 0.2 mm/rev, and rotating speed of 20 to 50 rpm. In other words, cutting was performed until the re-deposited film and knurling traces were eliminated, and a smooth surface was obtained. Subsequently, additional knurling was newly performed to the cut portion.

The surface roughness after knurling was Ra=17.6 μm, and variation in the coil thickness (difference between maximum thickness and minimum thickness) was 0.31 mm. It was thereby possible to obtain a like-new coil.

Comparative Example 1

With regard to a Ta coil in which the whole area of the coil was subject to erosion, the inner surface, the upper and lower edge parts, and the outer surface were cut based on the following cutting conditions; namely, cutting depth of 1.0 mm, feed of 0.2 mm/rev, and rotating speed of 65 to 80 rpm. In other words, cutting was performed until the re-deposited film and knurling traces were eliminated. The surface roughness was Ra=2.5 μm, and a smooth surface was not obtained. Subsequently, additional knurling was newly performed to the cut portion.

While the surface roughness after knurling was Ra=17.8 μm, since the control of cutting was insufficient, variation in the coil thickness (difference between maximum thickness and minimum thickness) was 0.51 mm, and it was not possible to obtain a suitable coil.

Comparative Example 2

With regard to a Ta coil in which the whole area of the coil was subject to erosion, the inner surface, the upper and lower edge parts, and the outer surface were cut based on the following cutting conditions; namely, cutting depth of 0.6 mm, feed of 0.3 mm/rev, and rotating speed of 25 to 60 rpm. In other words, cutting was performed until the re-deposited film and knurling traces were eliminated. The surface roughness was Ra=2.1 μm, and a smooth surface was not obtained. Subsequently, additional knurling was newly performed to the cut portion.

While the surface roughness after knurling was Ra=18.3 μm, since the control of cutting was insufficient, variation in the coil thickness (difference between maximum thickness and minimum thickness) was 6.3 mm, and it was not possible to obtain a suitable coil.

While sputtered grains are accumulated (re-deposited) on the surface of the tantalum coil disposed between the substrate and the sputtering target during sputtering, the spent coil is subject to cutting after the sputtering is complete to trim off the sputtered grains accumulated thereon so that the tantalum coil can be efficiently recycled. The present invention yields a superior effect of achieving lean manufacturing of new coils, improving productivity, and stably providing such coils.

Since the present invention can recycle coils with ease and high accuracy, the present invention can provide technology capable of improving the quality and productivity of electronic components, and stably providing semiconductor elements and devices. Also with this recycled coil, as with a new coil, the present invention can prevent the generation of particles, which is caused by flaking of the sputtered grains accumulated on the surface of the coil and the adhesion of the scattered flakes to the substrate surface, and can prevent the generation of arcing; and thereby effectively inhibit the flaking of the sputtered grains accumulated on the surface of the coil. Thus, the present invention is useful in a sputtering device that uses tantalum coils.

The invention claimed is:

1. A method for recycling a used tantalum coil of a sputtering apparatus, having a surface formed with knurling traces, wherein the surface of the used tantalum coil is cut to eliminate the knurling traces together with re-deposited films or eroded areas or both formed during sputtering on the surface of the used tantalum coil and obtain a flat and smooth surface having a surface roughness Ra of 1.6 μm or less, and thereafter the flat and smooth surface is knurled to form a new surface of the used tantalum coil provided with newly formed knurling traces.

2. The method for recycling a used tantalum coil of a sputtering apparatus according to claim 1, wherein the surface of the used tantalum coil is cut under conditions including a cutting depth of 0.4 to 0.8 mm, a feed of 0.05 to 0.2 mm/rev, and a rotation speed of 20 to 80 rpm.

3. The method for recycling a used tantalum coil of a sputtering apparatus according to claim 2, wherein the new surface of the used tantalum coil provided with the newly formed knurling traces has a roughness, Ra, of 15 μm or more.

4. The method for recycling a used tantalum coil of a sputtering apparatus according to claim 3, wherein the new surface of the used tantalum coil provided with the newly formed knurling traces has a variation in thickness of 0.5 mm or less, the variation in thickness being defined as a thickness difference between a maximum thickness and a minimum thickness of the tantalum coil as recycled.

5. A recycled tantalum coil for sputtering produced by the method according to claim 4, characterized in that the recycled tantalum coil has a surface provided with newly formed knurling traces and has a variation in thickness of 0.5 mm or less, and that the surface provided with the newly formed knurling traces has a roughness, Ra, of 15 μm or more.

6. The method for recycling a used tantalum coil of a sputtering apparatus according to claim 1, wherein the new surface of the used tantalum coil provided with the newly formed knurling traces has a roughness, Ra, of 15 μm or more.

7. The method for recycling a used tantalum coil of a sputtering apparatus according to claim 1, wherein the new surface of the used tantalum coil provided with the newly formed knurling traces has a variation in thickness of 0.5 mm or less, the variation in thickness being defined as a thickness difference between a maximum thickness and a minimum thickness of the tantalum coil as recycled.

8. A recycled tantalum coil for sputtering produced by the method according to claim 1, characterized in that the recycled tantalum coil has a surface provided with newly formed knurling traces and has a variation in thickness of 0.5 mm or less, and that the surface provided with the newly formed knurling traces has a roughness, Ra, of 15 μm or more.

9. A method for recycling a used tantalum coil of a sputtering apparatus, consisting of the steps of:
  cutting a surface of the used tantalum coil to eliminate a re-deposited film formed during sputtering on the surface of the used tantalum coil and until irregularities produced by the re-deposited film or an erosion part and knurling traces are eliminated and a smooth surface having a surface roughness Ra of 1.6 μm or less is obtained; and
  after said cutting step, subjecting the surface to knurling to provide the surface with the surface roughness Ra of 15 μm or more;
  wherein the cutting step and the knurling step have no intervening processing step therebetween.

10. The method according to claim 9, wherein conditions for said cutting step include cutting depth of 0.4 to 0.8 mm, feed of 0.05 to 0.2 mm/rev, and rotating speed of 20 to 80 rpm.

11. The method according to claim 10, wherein a variation in thickness of the tantalum coil, defined as a difference between maximum thickness and minimum thickness of the tantalum coil, after said knurling step is 0.5 mm or less.

* * * * *